United States Patent [19]

Pelc

[11] Patent Number: 4,896,113
[45] Date of Patent: Jan. 23, 1990

[54] USE OF REPEATED GRADIENT ECHOES FOR NOISE REDUCTION AND IMPROVED NMR IMAGING

[75] Inventor: Norbert J. Pelc, Wauwatosa, Wis.

[73] Assignee: General Electric Company, Milwaukee, Wis.

[21] Appl. No.: 368,145

[22] Filed: Jun. 16, 1989

Related U.S. Application Data

[63] Continuation of Ser. No. 276,054, Nov. 25, 1988, abandoned.

[51] Int. Cl.[4] .............................................. G01R 33/20
[52] U.S. Cl. ..................................... 324/309; 324/312
[58] Field of Search ............... 324/300, 307, 309, 312, 324/314; 128/653

[56] References Cited

U.S. PATENT DOCUMENTS

| | | | |
|---|---|---|---|
| 4,684,891 | 8/1987 | Feinberg | 324/307 |
| 4,748,409 | 5/1988 | Frahm | 324/309 |
| 4,761,613 | 8/1988 | Hinks | 324/307 |
| 4,766,379 | 8/1988 | Miyazaki | 324/309 |
| 4,780,675 | 10/1988 | De Meester | 324/312 |
| 4,792,758 | 12/1988 | Sattin | 324/309 |
| 4,799,014 | 1/1989 | Nakabayashi | 324/314 |
| 4,803,432 | 2/1989 | Perman | 324/307 |
| 4,808,928 | 2/1989 | Frahm | 324/309 |

OTHER PUBLICATIONS

*The Field Dependence of NMR Imaging: II Arguments Concerning and Optimal Field Strength;* D. I. Hoult, C-N Chen, and V. J. Sank, Magnetic Resonance in Medicine, 730–746, Academic Press, Inc. (1986).

Co-pending U.S. patent application Ser. No. 276,088, Pelc et al, filed Nov. 23, 1988.

*Primary Examiner*—Michael J. Tokar
*Attorney, Agent, or Firm*—Quarles & Brady

[57] ABSTRACT

A pulse sequence of an NMR system is disclosed which produces two spin echo signals which may be acquired. In addition, one or more gradient echos are produced and acquired. The gradient echo data is combined with the spin echo data to improve signal to noise ratio, provide $T_2'$ mapping, reduce motion induced artifacts, measure and correct for RF pulse imperfections, and to provide improved $T_2$ measurement.

20 Claims, 3 Drawing Sheets

FIG. 4

USE OF REPEATED GRADIENT ECHOES FOR NOISE REDUCTION AND IMPROVED NMR IMAGING

This application is a continuation of application Ser. No. 276,054, filed 11/25/88, now abandoned.

BACKGROUND OF THE INVENTION

This invention relates to nuclear magnetic resonance (NMR) imaging and more particularly to a radio frequency and magnetic gradient sequence to provide improved NMR imaging.

In an NMR imaging sequence, a uniform magnetic field $B_0$ is applied to the imaged object along the z axis of a Cartesian coordinate system, the origin of which is at the center of the imaged object. The effect of the magnetic field $B_0$ is to align the object's nuclear spins along the z axis. In response to RF pulses of the proper frequency oriented along the y axis, the nuclei resonate at their Larmor frequencies according to the following equation:

$$\omega = \gamma B_0$$

where $\omega$ is the Larmor frequency, and $\gamma$ is the gyromagnetic ratio which is constant and a property of the particular nucleus. Water, because of its relative abundance in biological tissue and the properties of its nuclei, is of principle concern in such imaging. The value of the gyromagnetic ratio $\gamma$ for water is 4.26 khz/gauss and therefore in a 1.5 Tesla polarizing magnetic field $B_0$ the resonant or Larmor frequency of water is approximately 63.9 Mhz.

In the well known slice select RF pulse, a z axis magnetic field gradient $G_z$ is applied at the time of these RF pulses so that only the nuclei in a slice through the object in an x-y plane are excited into resonance. After the excitation of the nuclei, magnetic field gradients are applied along the x and y axes and an NMR signal is acquired. The gradient along the x axis, $G_x$, causes the nuclei to precess at different resonant frequencies depending on their position along the x axis, that is, $G_x$ spatially encodes the precessing nuclei by frequency. Similarly, the y axis gradient, $G_y$, is incremented through a series of values and encodes y position into the rate of change of phase as a function of gradient amplitude, a process typically referred to as phase encoding. From this data set a slice image may be derived according to well known reconstruction techniques. A general description of one such image reconstruction technique based on the Fourier transform is contained in the book "Magnetic Resonance Imaging, Principles and Applications" by D. N. Kean and M. A. Smith. Images in other orientations can be generated by rotation of the gradient directions, as is well known in the art.

The present invention concerns an NRM pulse sequence for use with image reconstruction techniques including but not limited to "Fourier transform" and "Projection Reconstruction" techniques. The descriptions that follow, therefore, will cover only a single NMR excitation, including specifically descriptions of the RF pulse series and descriptions of the magnetic field gradient waveforms for a single gradient axis $G_x$. It is understood that the described sequences are typically repeated many times, in combination with gradient fields on the other gradient axes, in order to produce a complete slice image sequence as is understood in the art.

As described briefly above, a typical NMR imaging sequence begins with the stimulation of selected nuclei into resonance by means of an RF pulse at the Larmor frequency of those nuclei. The energy and the phase of this initial RF pulse may be controlled such that at its termination the magnetic moments of the individual nuclei are precessing around the z axis within the x-y plane. A pulse of such energy and duration is termed a 90° RF pulse.

An NMR signal acquired after this 90° RF pulse would be that of an exponentially decaying sinusoid of a frequency equal to the Larmor frequency of the nuclei and with an exponential amplitude envelope with a time constant $T_2^*$. Such a signal is termed a free induction decay (FID). The decay envelope of the FID reflects both the loss of transverse magnetization due to spin-spin relaxation ($T_2$), and the dephasing of the microscopic magnetic moments due to magnetic field inhomogeneities causing a further loss of net magnetization due to cancellation ($T_2'$).

The time constant $T_2^*$ may be thus separated into two components as defined in the equation below:

$$\frac{1}{T_2}* = \frac{1}{T_2} + \frac{1}{T_2'} \quad (1)$$

$T_2$ is termed the "spin-spin" relaxation time and is a measure of how quickly the individual magnetic moments lose their phase coherence as a result of interaction with the local atomic structure. $T_2$ provides useful information about the local chemical environment and is valuable in distinguishing biological tissue. The effects of the spin-spin relaxation cannot be reversed by 180 degree pulses, to be described later.

$T_2'$ is also a measure of how quickly the magnetic moments lose their phase coherence, but in this case the dephasing is the result of larger scale magnetic field inhomogeneities rather than local stochastic atomic interaction. Such large scale magnetic field inhomogeneities may result from imperfections in the magnet producing the $B_0$ field or because of magnetic field distortions resulting from the spatially varying magnetic susceptibility of the object being imaged.

The FID signal so described, arising immediately after the 90° RF pulse, is often not acquired. This is because data acquisition is delayed to allow $T_2$ to contribute strongly to signal characteristics and at these delays $T_2'$ and other off-resonance effects are undesirably strong. Accordingly, a technique known as "spin echo" is used. In the spin echo technique, a "180° RF" pulse is applied some time after the 90° RF pulse to flip each precessing nuclei approximately 180° to the extent that the individual nuclei have dephased after the 90° RF pulse because of magnetic field inhomogeneities ($T_2'$), the 180° RF pulse reverses the accumulated phase shifts and causes these nuclei to begin rephasing. At time after the 180° RF pulse equal to the delay between the 90° and 180° pulses, the nuclei are in phase and produce a "spin echo". The amplitude of this spin echo is less than that of the FID immediately after the 90° RF pulse as a result of $T_2$ decay. This $T_2$ decay is not reversed by the 180° RF pulse. Hence the relative amplitude of two or more spin echoes may be used to directly derive $T_2$ without contribution from $T_2'$. Repeated 180° RF pulses will produce repeated spin echoes, as is well known in the art, each with lesser amplitude as dictated by the $T_2$ decay time constant.

As was mentioned previously, during the period of acquisition of the NMR signal, a frequency encoding magnetic gradient is applied. The effect of this "read-out" gradient, in changing the Larmor frequencies of the precessing nuclei in proportion to their position along the gradient axis, is also to dephase the nuclei. In order to accurately measure the peak of the spin echo, a reverse polarity gradient may be applied prior to the read-out gradient to substantially shift the occurrence of the peak of the signal to the center of the read-out gradient. Equivalently, a positive polarity gradient may be applied between the 90° and 180° pulses. In any case, the amplitude and duration of the "prewinder" pulses are selected to center the read-out gradient and to make this signal peak (i.e. the gradient echo) coincident within the temporal occurrence of the spin echo. In another way of speaking, after a prewinder pulse, the effect of the read-out gradient is to "refocus" the prewinder dephased nuclei to produce the gradient echo. Gradient echos and the use of prewinder pulses will be discussed further below.

The quality of the image that may be constructed through NMR techniques is limited by the signal-to-noise ratio (SNR) of the spin echo signal. It is generally understood that SNR improves as magnet field strength $B_0$ increases. Depending on the technical details of the instrument, SNR is at least proportional to $B_0$ and possibly proportional to $B_0$ to a power of 3/2 or 7/4.

Nevertheless, researchers have noticed that the full SNR improvement in NMR imaging that may be achieved from increasing the magnetic field $B_0$ may be limited because of chemical shift artifacts which increase as the magnetic field $B_0$ is increased. Such artifacts result directly from the spatial encoding of the nuclear resonance frequencies in the imaged object by means of the gradient field. The gradient magnetic field is superimposed on the magnetic field $B_0$ such that the magnetic field along the gradient axis, for example X, is proportional to the displacement along that axis. For an object of uniform composition, the gyromagnetic ratio will be constant, and the Larmor frequencies of the resonances of the individual nuclei will therefore uniquely identify their location along the axis X. If, however, the imaged body is not uniform but has substances of several chemical shifts, the resonant frequencies will no longer uniquely identify the location of the substance along the X axis. Accordingly, if the resonant frequency is used in the imaging algorithm to determine spatial position, substances of different chemical shifts will appear shifted with respect to each other and with respect to their true locations. Since the chemical shift frequencies are proportional to $B_0$, chemical shift displacement artifacts are proportional to $B_0$.

The effective chemical shift in the image may be reduced by increasing the slope of the magnetic field (the gradient strength) along the axis. Increasing the gradient directly increases the difference in resonant frequencies between nuclei separated by a given distance along the gradient axis. To a first approximation therefore, a change in $B_0$ requires a proportional change in the gradient to maintain a constant chemical shift artifact.

An increased gradient, however, increases the bandwidth of the NMR signal which must be acquired because of the corresponding spread in the resonant frequencies of the object's nuclei. This wider bandwidth signal requires a wider bandwidth receiving circuitry and therefore permits the acquisition of increased noise approximately in proportion to the square root of the bandwidth. The net effect, therefore, of compensating for increased chemical shift by increased gradient is a decrease in SNR by the square root of the bandwidth. Because the bandwidth is proportional to the required gradient increase (and therefore $B_0$ for constant chemical shift artifacts), it follows that the SNR improvement in NMR images resulting from an increased magnetic field $B_0$ may be as weak as the square root of $B_0$ if additional techniques are not used to improve the SNR of the acquired signal.

One method has been proposed to address this SNR problem. This method is to use repeated spin echos produced by a series of 180° RF pulses. This approach is limited both by the ability of a patient to tolerate additional RF exposure and the technique's requirement of very good 180 degree pulses, and the time required to produce those pulses. One aspect of present invention yields another means of improving SNR.

There may be instances where estimation of $T_2'$ is of interest. Present methods of estimating $T_2'$ involve repeated scanning. Unfortunately, these methods greatly increases the examination time. The method of the present invention is able to measure $T_2'$ without this penalty.

As will be discussed below, presently used methods for measuring $T_2$ can be very sensitive to the quality of the 180 degree pulses used to produce spin echoes. Methods which are not sensitive to such pulse errors require much longer examination times. The method of the present invention allows measurement of RF pulse imperfections and measurement of $T_2$ with reduced sensitivity to such imperfections without significant increases in the examination time.

SUMMARY OF THE INVENTION

The present invention relates to an NMR imaging pulse sequence which uses both spin echoes and repeated gradient echoes to derive additional data for a given NMR excitation.

It is one object of the invention to improve the SNR of an acquired NMR image without further increases in magnetic field $B_0$; without the use of additional RF excitations; and without increasing chemical shift artifacts. In addition to acquiring an echo signal centered at the time of the spin echo, additional gradient echoes are induced on at least one side of the spin echo to obtain additional signals functionally dependent on $T_2$ and $T_2'$. These signals may be combined to provide improved SNR.

It is another object of the invention to combine such gradient echo signals with conventional spin echo signals so as to minimize artifacts due to contributions from the presence of short $T_2'$ as a result of magnetic field inhomogeneities. If such inhomogeneities are localized in a particular volume of the imaged object, as would be the case from inhomogeneities induced by variations in the imaged object's magnetic susceptibility, the gradient echo signals away from the spin echo signal may be greatly reduced in those areas. This object is accomplished by reducing the allowed contribution of these image signals in regions which contain this artifact.

It is a further object of this invention to reduce motion artifacts in an NMR image. The difference in time between the gradient echo acquisition and the spin echo acquisition causes the artifacts in the gradient echo image and spin echo image to be somewhat uncorrelated. Combination of the images therefore reduces motion induced artifacts.

It is yet another object of the invention to acquire the data necessary for $T_2'$ imaging or mapping of the imaged object. Certain areas of medical interest have distorted magnetic fields as a result of sharp variations in the magnetic susceptibility within tissues. For example, iron at the site of a hemorrhage may sharply change the magnetic susceptibility at that location and therefore the magnetic field in the neighborhood of the iron. $T_2'$ maps may be readily isolated from the spin echoes and gradient echoes acquired according to this invention.

It is yet another object of this invention to provide an accurate $T_2$ measurement independent of errors or imperfections in the 180° of this invention to provide an accurate $T_2$ measurement independent of errors or imperfections in the 180° RF pulse. Imperfections in the 180° RF pulse may result in more or less than 180° spin rotation and produce artifactural signal loss in subsequent echoes and shading errors in the reconstructed NMR images. The gradient echoes acquired in the described invention can be used along with spin echo signals to provide an estimate of any errors produced by the 180° RF pulse. Such estimates may be useful by themselves and also may be used to correct errors in the measurement of $T_2$.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
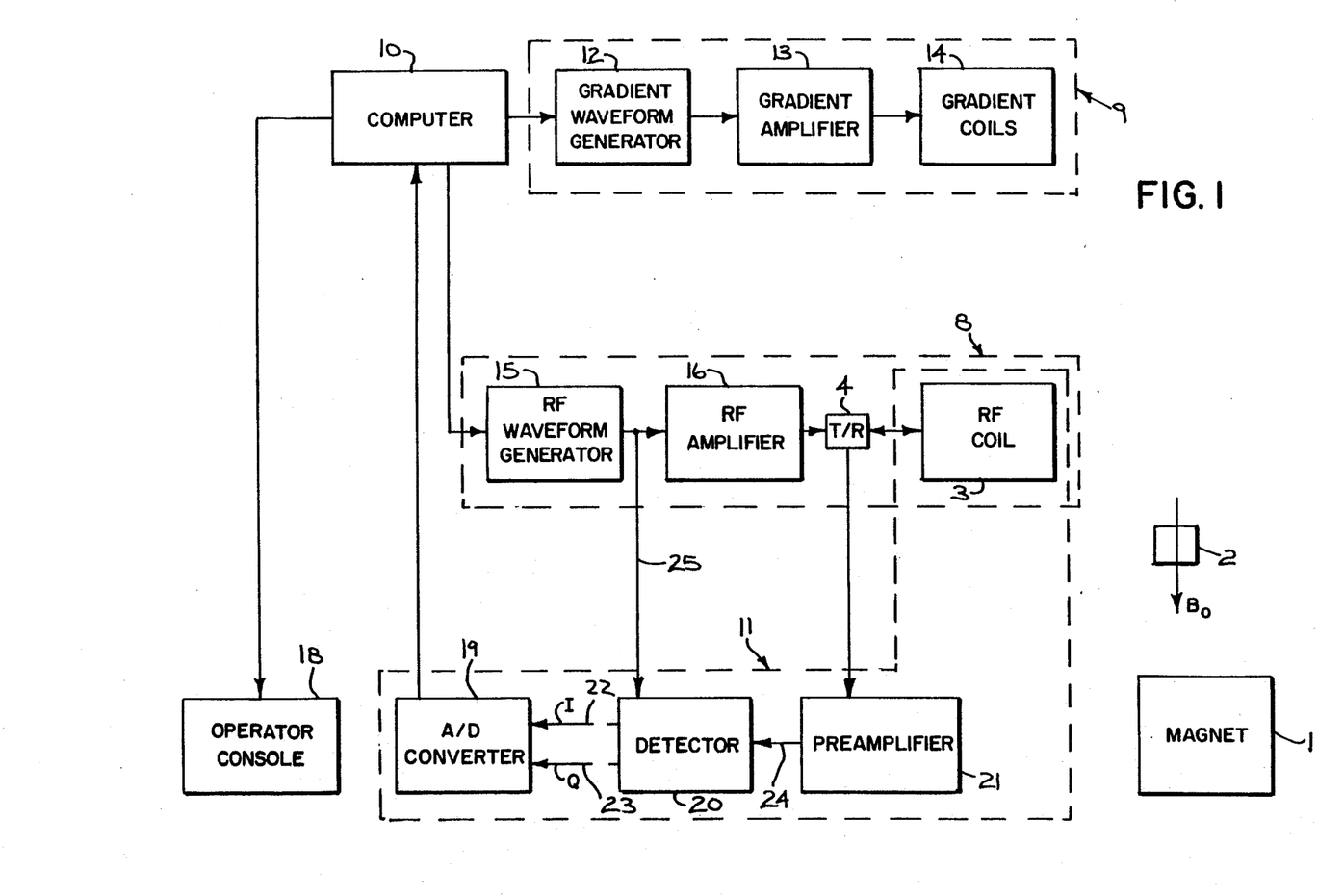
FIG. 1 is a schematic block diagram of an NMR system employing this invention.

FIG. 1 is a block diagram of an NMR imaging system of a type suitable for the practice of the invention. It should be recognized, however, that the claimed invention may be practiced on any suitable apparatus.

The NMR imaging system includes a magnet 1 to provide a field $B_0$ for polarizing the nuclear spins of the imaged object 2. A radio frequency antenna, RF coil 3, provides for both the transmission of the RF stimulating pulses, e.g. 90° and/or 180° RF pulses, and for the receiving of the NMR signal to be described in detail below. Transmit/Receive Switch 4 serves to switch the antenna between the RF transmitting and receiving modes.

A computer 10 provides timing sequences for control of the gradient signal chain 9 and the RF signal chain 8 and provides for reception of the sampled and digitized NMR signal from the signal acquisition chain 11 for processing and image reconstruction.

The gradient signal chain 9 consists of a gradient waveform generator 12 controlled by the computer 10. The computer 10 controls the waveform's timing and wave shape including its amplitude and duration. The gradient waveform generator 12 is followed by a gradient amplifier 13 which boosts the power of the gradient signal to drive one of several gradient coils 14, one associated with each axis and shown collectively. The waveform associated with each gradient coil $G_x$, $G_y$, and $G_z$ may be separately controlled.

The RF signal chain 8 includes an RF waveform generator 15 which is also controlled by the computer 10 with respect to the RF pulse's timing, shape, frequency, phase, and total power so as to provide, as required, 90° or 180° RF pulses as described above. The RF pulse signal 25 is boosted by amplifier 16 and coupled to RF antenna 3 through the transmit/receive switch 4 so as to excite the nuclei of the sample 1 as has been described.

The generated NMR signal is received by the signal acquisition chain 11. RF antenna 3, which may be in certain instances a surface coil, is connected through the transmit/receive switch 4, to preamplifier 21 which provides amplification of the acquired signal. Preamplifier 21 is followed by a quadrature detector 20 which extracts amplitude and phase information 22 by comparing the input signal to sine and cosine reference local oscillators and producing an in phase (I) and quadrature phase (Q) amplitude signals. The quadrature detector 20 provides the I and Q signals to A to D converter 19. The I and Q signals are filtered and converted into digital form by the A to D converter and transmitted to the computer for image reconstruction through techniques known in the art.

Figure 2:
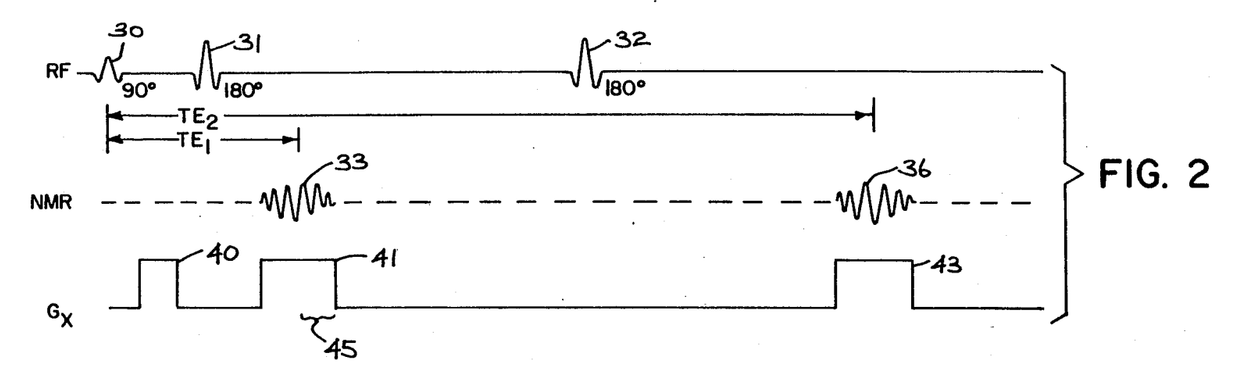
FIG. 2 is a graphic representation of a conventional spin echo NMR pulse sequence.

The following discussion considers a variable echo pulse sequence, shown in FIG. 2, into which the the present invention may be incorporated. The variable echo pulse sequence is now described by way of illustration, however it should be understood that the invention may be incorporated with other pulse sequences as will be apparent to one skilled in the art.

FIG. 2 shows a single pulse sequence in a conventional spin echo imaging sequence consisting of a 90° RF pulse 30 followed $TE_1/2$ later by a 180° RF pulse 31 of the type previously described. At substantially $TE_1$ following the 90° RF pulse 30 a "spin echo" NMR signal 33 is formed and acquired by the signal acquisition chain 11. A second 180° pulse 32 is transmitted $(TE_2-TE_1)/2$ later to create a second spin echo NMR signal 36, occurring substantially $TE_2$ after the 90° RF pulse 30 and also acquired by the signal acquisition chain 11.

During the period of the spin echos 33 and 36, readout gradient $G_x$ is activated as indicated by pulses 41 and 43 respectively. These gradient pulses serve to frequency encode the nuclear spins during the acquisition of spin echoes 33 and 36, so as to distinguish spatially volume elements of spins according to their position along the x axis. Gradient pulse 40 is a "prewinder pulse" and serves to dephase the nuclei so the center of the gradient echo and the spin echo 33 will occur at the center of gradient pulse 41, as has been previously described. The peak retardation effect of pulse 40 is dependent on its area and hence prewinder pulse 40 may be of arbitrary shape but its area is approximately one-half that of gradient pulse 41 if the centers of the gradient and spin echoes are to coincide.

In a similar manner, the second half of gradient pulse 41, during time period 45, in addition to encoding the signal acquired during this time, serves as a prewinder pulse for the second spin echo 36. Also present, but not shown, is a phase encoding pulse whose form and function is known in the art and is unaffected by the present invention.

Each spin echo signal 33 and 36 is sampled and digitized in an array $e_1(i, j)$ and $e_3(i, j)$ for the first and second spin echos respectively, where i is the sample number and j is the phase encoding amplitude number. The image reconstruction process yields arrays $E_1(l, m)$ and $E_3(l, m)$ for the image formed from spin echo signal $e_1$ and $e_3$, where l and m identify the location of a picture element ("pixel") in the image array. The intensity of a pixel (l, m) of the reconstructed image corresponds to the NMR signal strength for a given volume element ("voxel") of the imaged object. Henceforth, the variables (l, m) will be omitted from the notation but are implicitly present. For the first spin echo image $E_1$ the signal intensity is given by the following equation:

$$E_1 = PD \, e^{-TE_1/T_2} \tag{2}$$

where PD is the pseudo density, which is a measure of the spin density, i.e. the number of protons within the voxel which are available for excitation including the effects of previous RF excitations ($T_1$ weighting), and $T_2$ is the spin-spin relaxation time as has been previously described and which may be voxel dependent.

Similarly, the intensity of the second spin echo image $E_3$ is:

$$E_3 = PD \, e^{-TE_2/T_2} = E_1 \, e^{-\Delta TE_1/T_2} \tag{3}$$

where $\Delta TE = TE_2 - TE_1$.

It should be noted that $E_1$ and $E_3$ are functions only of $T_2$ rather $T_2^*$ for the reasons explained previously, that is, the phase reversal effect (or rephasing effect) of the 180° RF pulses 31 and 32 cancel the effects of $T_2'$ which arise from magnetic field inhomogeneities.

The pulse sequence of FIG. 2 is popular because the first image, if acquired with minimal $TE_1$ (e.g. 10 to 20 msec) has minimal $T_2$ weighting and thus provides pseudodensity information. Typically, a time longer than $T_1$ is allowed to elapse between repetitions of the pulse sequence to minimize $T_1$ effects, as is known in the art. The second image $E_3$ is acquired with a $TE_2$ that is rather long (e.g. 70 to 100 msec) to accentuate $T_2$ differences between tissues. In this typical usage, there is considerable time between echoes 33 and 36 during which no NMR measurements are being made.

This "idle" time can be used in a variable bandwidth version of this acquisition to improve the SNR of the second echo, as is explained in copending application entitled "Variable Bandwidth Multiecho NMR Imaging". However, the variable bandwidth approach has increased chemical shift artifacts which may be detrimental and undesirable sometimes.

Figure 3:
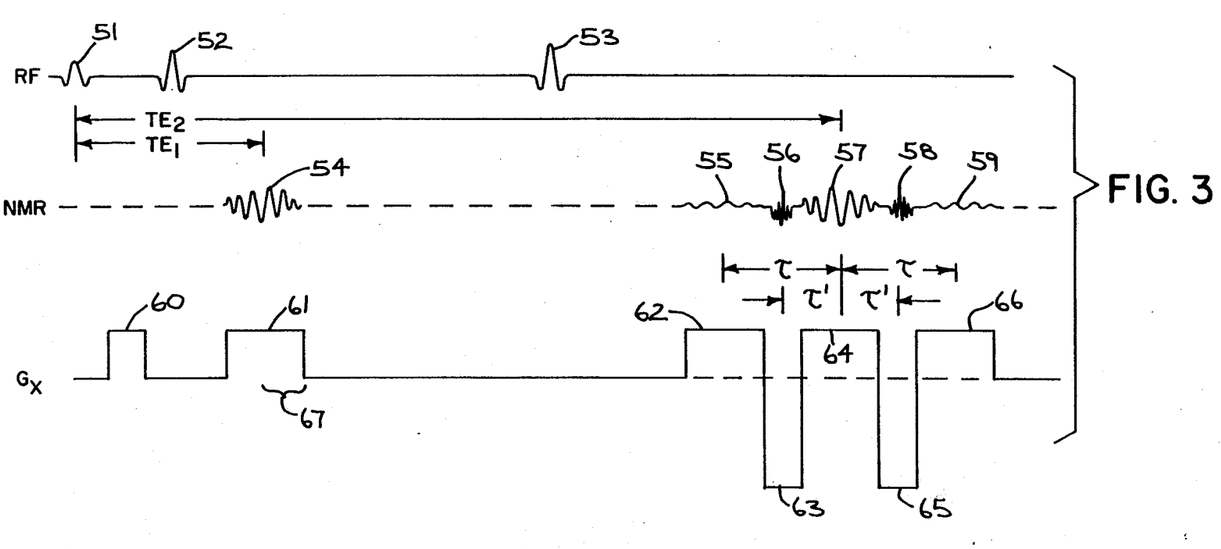
FIG. 3 is a graphic representation of a repeated gradient echo NMR pulse sequence according to the present invention.

As will now be described, the present invention can be employed to profitably use the "idle" time. A pulse sequence incorporating the present invention is shown in FIG. 3. A 90° RF pulse 51 is applied to sample 1 exciting the moments of the precessing nuclei into the x-y plane. A 180° RF pulse 52 is then applied to produce a spin echo 54 at a time $TE_1$ after the 90° pulse. Gradient $G_x$ is activated for a period of time between the 90° and 180° RF pulses 51 and 52 as a phase prewinder pulse 60 to delay the peak of the gradient echo so as to be coincident with the spin echo 54 and to occur approximately one-half way through the frequency encoding gradient 61. The signal generated, 54, is identical to that shown as 33 in FIG. 2. A second 180° pulse 53 is then applied, as before, to produce a second spin echo 57 at time $TE_2$ after the 90° RF pulse 51.

The second half of readout gradient pulse 61 during time period 67 operates in conjunction with the second 180° RF pulse 53 to provide a phase prewinding for the subsequent gradient pulse 62. As a result, echo 55 occurs centered within gradient pulse 62. Note that gradient echo 55 is not coincident with the spin echo 57 that occurs a short time later.

Gradient echo read-out pulse 62 is followed by an opposite polarity prewinder gradient pulse 63 of area substantially equal to the latter half of pulse 62 plus the former half of pulse 64 so as to center the subsequent echo 57 within read-out gradient pulse 64. The center of echo signal 57 is made coincident with the spin echo produced by the 180° RF pulse 53. This echo signal 57 is identical to the echo signal 36 in FIG. 2. The resulting spin echo image $E_3$ is, therefore, identical to that given above in the conventional spin echo sequence:

$$E_3 = PD \, e^{-TE_2/T_2} = E_1 \, e^{-\Delta TE_1/T_2} \tag{4}$$

The gradient echo 55 differs from the spin echo 57 in two ways. First, the decreased elapsed time between the 90° RF excitation pulse and the gradient echo 55 results in an increase in the signal intensity in the gradient echo 55, over spin echo 57, because there is less $T_2$ decay. In other words, since less time has elapsed, less net magnetization is lost through spin-spin relaxation. Second, at the time of gradient echo 55, the dephasing resulting from magnetic field inhomogeneities has not been fully cancelled as is the case with spin echo 57. Accordingly the signal strength of the gradient echo 55 is reduced by an amount dependant on the degree to which the nuclei remain dephased. The acquired gradient echo signal 55 produces a data set which is the sum of both of these effects. If $e_2$ is the matrix of measurements made of the signals, 55, at different phase encodings, and $E_2$ is the resulting image, the intensity of the reconstructed gradient echo image $E_2$ is:

$$E_2 = PD \, e^{-(TE_2-\tau)/T_2} e^{-\tau/T_2'} = E_3 e^{\tau/T_2} e^{-\tau/T_2'} \tag{5}$$

where $\tau$ is the time by which the gradient echo precedes the spin echo 57.

Spin echo read-out gradient pulse 64 is followed by an opposite polarity prewinder gradient pulse 65 of area substantially equal to the latter half of pulse 64 and the former half of pulse 66 so as to center the subsequent gradient echo 59 within read-out gradient pulse 66. The resulting gradient echo signal $e_4$ differs from spin-echo signal 57 in that a longer total period of time has elapsed since the 90 RF excitation pulse 51 and therefore there has been correspondingly greater $T_2$ decay. Further, since 59 is not centered at the spin echo there is $T_2'$ signal loss as well. If $E_4$ is used to refer to the image produced with the signal $e_4$ acquired form the gradient echo 59, the signal intensity of this image is:

$$E_4 = PD \, e^{-(TE_2+\tau)/T_2} e^{-\tau/T_2'} E_3 e^{-\tau/T_2} e^{\tau/T_2'} \tag{6}$$

where $\tau$ is the time by which the gradient echo 59 follows the spin echo 57.

Henceforth, even though $E_1$ and $E_3$ are produced by the confluence of the gradient echo and spin echo, they will be referred to as spin echo images. $E_2$ and $E_4$ will be referred to as gradient echo images to emphasize that they were acquired at times not coincident with the spin echoes.

The time between the the spin echos 54 and 57 is selected to provide sufficient time for the additional acquisition of gradient echo 55. However, due to the typical choice of $TE_1$ and $TE_2$ as described previously, this is not a major limitation. It should be noted that the gradient echoes need not be centered within the gradient pulses 62 and 66 but may be shifted toward the spin echo to shorten the total acquisition time of this sequence. To do this, the areas of pulses 61 and 65 are appropriately chosen. Depending on the desired width of pulse 62, pulse 61 has to be selected to provide appropriate prewinding as has been described. The result of this shift is primarily a phase shift in the resulting image. In most of the following uses of these images, the magnitude (and not the phase) of the image is used and so the phase shifts are of no consequence. In any case, the phase shift due to the echo shift can be calculated from knowledge of the prewinder pulse area and thereby corrected.

Repeated gradient pulses may be used to acquire additional gradient echo signals surrounding a spin echo in an extension of the procedure described above. Additionally, the prewinder gradient pulses 63 and 65 may be used to acquire gradient echo pulses 56 and 58 respectively. These gradient echoes 56 and 58 may be used in lieu of or in combination with the gradient echoes 55 and 59 by reversing the order of the data from pulses 56 and 58 as it is acquired in time and applying conventional image reconstruction techniques to the resulting signals. The signal intensity of the gradient echo images given by the signals 56 and 58 from these negative gradient lobes 63 and 65 are as follows, respectively:

$$E_5 = PD\, e^{-(TE2-\tau')/T2} e^{-\tau'/T2'} \qquad (7)$$

$$E_6 = PD\, e^{-(TE2+\tau')/T2} e^{-\tau'/T2'} \qquad (8)$$

where $\tau'$ is the time by which the gradient echoes 56 and 58 precede and follow the spin echo 57, respectively.

In some cases one may choose to collect only one additional gradient echo due to, for example, time constraints. In these cases only some of the benefits of the present invention can be obtained, as will be clear after the discussion below. Conversely, in some cases one may choose to precede and/or follow the first or only spin echo with additional gradient echoes.

In the following discussion, I will return to the sequence of FIG. 3 and assume that the image data which is collected are spin echo and gradient echo data sets $E_1$ to $E_4$, described above. Extensions of the teaching of the invention to cases including additional or fewer gradient echoes will be apparent to those skilled in the art.

The signals acquired through the above described gradient echo techniques may be used In any one or more of the following ways: (1) the combined information from the gradient echo images $E_2$ and $E_4$ and the spin echo image $E_3$ provides a composite reconstructed image with improved SNR, (2) the information in the gradient echo signals may be combined with the spin echo signal to provide a composite image with reduced image artifacts, (3) the information contained in the gradient echoes may be used to provide $T_2'$ images useful in certain clinical applications, (4) the gradient echo information may be combined with the spin echo information to provide an estimate of the effects of RF pulse imperfections and to thereby also enable a reduction in shading artifacts, (5) the estimated effects of RF pulse imperfections can be used to improve the accuracy of $T_2$ measurements.

1. NOISE REDUCTION

Images $E_2$ and $E_4$ may be combined with image $E_3$ to produce a composite image $\hat{E}_3$ with improved signal-to-noise. This is particularly appropriate if $\tau$ is small since the images $E_2$ through $E_4$ will have very similar $T_2$ weighting, and very similar signal characteristics in regions of long $T_2'$. The gradient echo signals $E_2$ and $E_4$ provide additional NMR information without the need of additional RF stimulation and RF power deposition in the patient. Several methods may be used to combine these signals including simple averaging. In many situations, it is desired that the composite image have primarily the signal characteristics of $E_3$ since in many cases the $T_2'$ effects are undesirable. Further, the differential $T_2$ weighting may also be undesirable. In these cases, simple averaging is not appropriate because it would allow some of the undesirable qualities of $E_2$ and $E_4$ to enter into the composite image $\hat{E}_3$. Instead, a weighting system as will now be described may be used.

Figure 4:
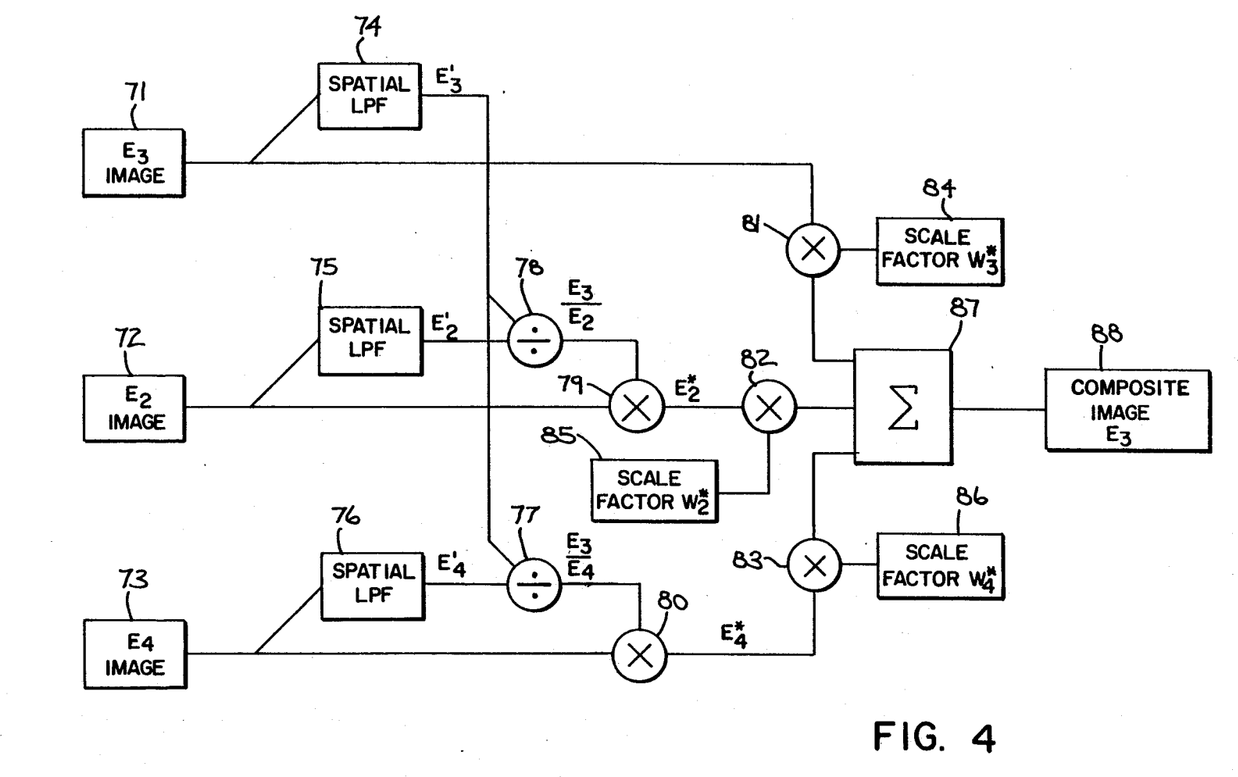
FIG. 4 is a block diagram of a method for combining reconstructed images according to the present invention.

Referring to FIG. 4 there is shown a block diagram of a weighted image combination method according to the preferred embodiment of the invention. The procedures shown may be performed numerically by computer 100 or may be performed by discrete analog or digital circuitry in accordance with the blocks shown.

Spin echo images $E_3$ and gradient echo images $E_2$ and $E_4$, as reconstructed according to generally understood techniques, and are stored as numerical arrays 71, 72, and 73 respectively. Each array is operated on by a spatial low pass filter 74, 75, and 76 to produce filtered images $E_3'$, $E_2'$, and $E_4'$. The filter frequency of the low-pass filter is selected to reduce noise while allowing the gross signal characteristics, including the $T_2'$ effects and $T_2$ effects to pass through. Thus, it is assumed that these differential effects are contained principally in the low spatial frequencies.

Weighting factors w2 or w4 are then derived for each pixel of the $E_2$ and $E_4$ images respectively by a pixel by pixel division according to the following equation:

$$w2 = \frac{E_3'}{E_2'} \qquad (9)$$

$$w4 = \frac{E_3'}{E_4'} \qquad (10)$$

where as before, the pixel index notation has been left out for clarity.

The original unfiltered images $E_2$, and $E_4$ are then multiplied at blocks 79 and 80 by the corresponding weighting factors w2 and w4 for each pixel of the image. The resulting images $E_2^*$, and $E_4^*$ now have substantially the same signal characteristics as $E_3$ are summed at block 87 after being scaled by scaling factors w3*, w2*, and w4* stored in 84, 85, and 86 respectively, at multiplication blocks 81, 82, and 83 to produce composite image $\hat{E}_3$ 88.

The scaling factors may be constant over the images and produce an average of $E_3$, $E_2^*$, and $E_4^*$, but preferably vary between and within the images. While $E_3$, $E_2^*$, and $E_4^*$ have similar signal characteristics, they have different noise levels to the extent that $w_2$ and $w_4$ are not unity. Normalized to the SNR of $E_3$, the SNR of $E_2^*$ is $1/w_2$ while the SNR of $E_4^*$ is $1/w_4$. The SNR of the resulting combination $\hat{E}_3$ is maximized when each image is weighted by its relative SNR squared. Thus the ideal SNR is obtained when:

$$w_3^* = \frac{1}{1 + (1/w_2)^2 + (1/w_4)^2} = \frac{w_2^2 w_4^2}{w_2^2 w_4^2 + w_2^2 + w_4^2} \quad (11)$$

$$w_2^* = \frac{(1/w_2)^2}{1 + (1/w_2)^2 + (1/w_4)^2} = \frac{w_4^2}{w_2^2 w_4^2 + w_2^2 + w_4^2} \quad (12)$$

$$w_4^* = \frac{(1/w_4)^2}{1 + (1/w_2)^2 + (1/w_4)^2} = \frac{w_2^2}{w_2^2 w_4^2 + w_2^2 + w_4^2} \quad (13)$$

The process of weighting $E_2$ and $E_4$ by $w_2$ and $w_4$ corrects for slowly varying $T_2'$ effects. However, in regions of rapidly varying $T_2'$ effects some error may remain. Further immunity from these effects may be gained by deviating from the optimal signal to noise weights in suitably identified regions and suppressing $E_2^*$ and $E_4^*$ in those regions. If $\alpha$ denotes this suppression factor such that $0 \leq \alpha \leq 1$, the weights $w_2^*$, $w_3^*$, and $w_4^*$ are:

$$w_3^* = \frac{w_2^2 w_4^2 + (1-\alpha)w_2^2 + (1-\alpha)w_4^2}{w_2^2 w_4^2 + w_2^2 + w_4^2} \quad (14)$$

$$w_2^* = \frac{\alpha w_4^2}{w_2^2 w_4^2 + w_2^2 + w_4^2} \quad (15)$$

$$w_4^* = \frac{\alpha w_2^2}{w_2^2 w_4^2 + w_2^2 + w_4^2} \quad (16)$$

The frequency response of low-pass filters 74 through 76 are chosen to pass the $T_2'$ effects presently under consideration therefore $E_3-E_3'$, $E_2-E_2'$, $E_4-E_4'$ typicaly will contain highly similar high spatial frequency components ("edge information") and little $T_2'$ effect. Images formed from the ratios $(E_3-E_3')/(E_4-E_4')/(E_2-E_2')$ would therefore have very few features. Residual $T_2'$ effects therefore can be detected as regions where the ratios have absolute values quite different from unity and $\alpha$ is chosen to be small in the neighborhood of such regions.

An alternative embodiment is to choose $\alpha$ to be small in regions of short $T_2'$ and in neighborhoods surrounding such regions. A neighborhood surrounding the detected regions of short $T_2'$ or ratio deviation must be used due to the fact that the low-pass filters cause the effects of high spatial frequency $T_2'$ effects to spread.

It should be understood that some of the steps in the algorithm of FIG. 4 can be combined in the interest of computational efficiency. They have been presented as separate for the sake of clarity.

Note that the while the combined image $\hat{E}_3$ has higher SNR than $E_3$, they have the same chemical shift artifacts. Further, the SNR of $\hat{E}_3$ appraoches that which would be possible if chemical shift effects were not a concern, and thus returns the field strength dependance of SNR to at least a linear one.

2. ARTIFACT REDUCTION

Artifacts due, e.g. to motion or flow, are somewhat uncorrelated in the images $E_2$ to $E_4$. Thus, the combination of these images will tend to average the artifacts. They are uncorrelated because the errors in the data may be somewhat different, for example, due to different gradient moments or echo times, and also because the images will contain phase shifts which will cause even correlated artifacts to add or subtract differently in the input images $E_2$ to $E_4$. This latter effect can be enhanced by forcing additional phase shifts in the gradient echo images by additional gradient pulses.

3. $T_2'$ MAPS $T_2'$ information can be retrieved from signals $E_2$, $E_3$, and $E_4$, as follows:

$$E_2 E_4 / (E_3)^2 = e^{-2\tau/T_2'} \quad (17)$$

$$T_2' = 2\tau / \ln((E_3)^2/E_2 E_4) \quad (18).$$

Images of $T_2'$ decay (e.g. $e^{-2\tau/T_2'}$) or of $T_2'$ data may be clinically useful in situations where changes in magnetic susceptibility may identify a particular pathology, e.g. the presence of iron in a hemorrhage. Note that $T_2'$ is strongly dependent on $E_3$ and hence its SNR is strongly dependent on the noise in $E_3$. Accordingly, the noise reduced combination image $\hat{E}_3$ may be substituted for $E_3$ in the above equation with improved resulting SNR.

4. ESTIMATION OF RF PULSE IMPERFECTION EFFECTS $T_2$ is usually calculated using the formula:

$$E_3/E_1 = e^{-\Delta TE/T_2} \quad (19)$$

$$T_2 = TE / \ln(E_1/E_3) \quad (20)$$

where $\Delta TE = TE_2 - TE_1$

However, $E_1$ and $E_3$ are separated by 180° RF pulse 53, and imperfections in the 180° RF pulse will cause there to be artifactually lower signal in $E_3$. This in turn will produce shortened $T_2$ measurements. If 180° RF pulse imperfections reduce $E_3$ by a factor F, $0 \leq F \leq 1$, which may vary across the image, then:

$$E_3/E_1 = F e^{-\Delta TE/T_2} \quad (21)$$

and the calculated $T_2$ will be:

$$T_{2,calc} = \Delta TE / (\ln(E_1/E_3)) = T_2/(1-(T_2 \ln(F))/\Delta TE) \quad (22)$$

Accordingly, the error in the measurement of $T_2$ is approximately:

$$error = T_2^2 \ln(F) / \Delta TE \quad (23)$$

To avoid this error, $T_2$ may be calculated by using the $E_2$ and $E_4$ signals which are not separated by a 180° RF pulse:

$$E_4/E_2 = e^{-2\tau/T_2} \quad (24)$$

$$T_2 = 2\tau/ln(E_2/E_4) \quad (25)$$

The calculation of $T_2$ as given in equation 25, however, has a lower SNR as a result both of the lower signal level of $E_2$ and $E_4$, resulting from the longer period of signal decay after the 90° RF excitation pulse and due to $T_2'$ decay, and as a result of the relatively brief time between the measurement of $E_2$ and $E_4$ which produces only a small differential $T_2$ decay. Thus, while $T_2$ calculated by equation 25 is more accurate in that is is unbiased by RF pulse imperfections, it is potentially less precise. However, F is known to be a slowly varying function of position. In the preferred embodiment, therefore, the $T_2$ information in the gradient echoes is used to derive a value for F as follows:

$$F = (E_3/E_1(E_2/E_4)\Delta TE/2\tau \quad (26).$$

To the extent that the effects of imperfections in the 180° RF pulse are a slowly varying function of position within the object, F may be smoothed or modeled as a slowly varying function of space to lessen the effects of noise in the measurements and to produce the estimated pulse imperfection effect $F^*$. Equation 26 estimates the effects of RF pulse imperfections only to the extent that the material in the voxel has a single component $T_2$ decay. In regions of significant multicomponent $T_2$ decay F will be under estimated. Further, it will be difficult to measure F in regions of short $T_2'$ since in those regions $E_2$ and $E_4$ will be small. Therefore in calculating $F^*$ using the preferred embodiment, measured F values in regions of the imaged object are ignored where substances exist with multicomponent $T_2$ decay, or short $T_2'$.

The spatially slowly varying model $F^*$, can be used to correct $E_3$, or the noise reduced combined image, for the effects of pulse imperfections. To correct an image, the image is simply divided by $F^*$.

IMPROVED $T_2$ CALCULATIONS

Once $F^*$ is calculated as taught above, improved $T_2$ measurements can be obtained by correcting for RF pulse imperfections:

$$T_{2,corr.} = \Delta TE/ln(F^* E_1/E_3) \quad (27).$$

Additionally the SNR of the $T_2$ measurement can be improved by substituting the noise reduced combination $\hat{E}_3$ for $E_3$ in the above equation.

While this invention has been described with reference to particular embodiments and examples, other modifications and variations, such as application to projection reconstruction imaging techniques, will occur to those skilled in the art in view of the above teachings. Accordingly, the present invention is not limited to the preferred embodiment described herein, but is instead defined in the following claims.

I claim:

1. A method for producing a spin echo and a gradient echo signal to produce an image, the steps comprising:
   (a) applying a polarity magnetic field to the object to be imaged;
   (b) exciting the nuclei in the object with an RF excitation pulse;
   (c) applying a spin echo producing RF pulse to produce a spin echo signal at a first time T;
   (d) acquiring the spin echo signal at the first time T during the application of a first read out gradient; and
   (e) acquiring a gradient echo signal at at least one time $T+\tau$ and $T-\tau$ during the application of a second read out gradient.

2. The method as recited in claim 1 wherein the second read out gradient is of the same polarity as the first read out gradient.

3. The method as recited in claim 1 wherein the second read out gradient is of the opposite polarity as the first read out gradient.

4. The method as recited in claim 1 including the step of applying a prewinder pulse prior to the acquisition of the gradient echo signal.

5. The method as recited in claim 1 in which a second gradient echo signal is acquired during the application of a third read out gradient.

6. A method of improving the quality of an NMR image comprising the steps of:
   (a) acquiring a spin echo signal array and a gradient echo signal array;
   (b) reconstructing the spin echo signal array and the gradient echo signal array to produce spin echo image and a gradient echo image respectively; and
   (c) combining the gradient echo image and the spin echo image to produce a composite image.

7. The method of claim 6 wherein the spin echo image and gradient echo image are combined by averaging together the corresponding pixels.

8. A method of improving the quality of an NMR image comprising the steps of:
   (a) acquiring a spin echo signal array and a first and second gradient echo signal array;
   (b) reconstructing the spin echo signal array and the first and second gradient echo signal arrays to produce a spin echo image $E_3$ and a first and second gradient echo image $E_2$ and $E_4$ respectively;
   (c) low-pass filtering the spin echo image $E_3$ and gradient echo images $E_2$ and $E_4$ to produce a filtered spin echo image $E_3'$ and filtered gradient echo images $E_2'$ and $E_4'$;
   (d) dividing the intensity value of each pixel of the filtered spin echo image $E_3'$ by the intensity value of the corresponding pixel of filtered gradient echo images $E_2'$ to produce a first weighting factor image w2;
   (e) dividing the intensity value of each pixel of the filtered spin echo image $E_3'$ by the intensity value of the corresponding pixel of filtered gradient echo images $E_4'$ to produce a second weighting factor image w4;
   (f) multiplying each pixel of the gradient echo image $E_2$ by the weighting factor image w2 for that pixel to produce a modified gradient echo image $E_2^*$;
   (g) multiplying each pixel of the gradient echo image $E_4$ by the weighting factor image w4 for that pixel to produce a modified gradient echo image $E_4^*$; and
   (h) summing the corresponding pixels of the spin echo image $E_3$ and the modified gradient echo image $E_2^*$ and the modified gradient echo image $E_4^*$.

9. The method of claim 8 including the additional steps of weighting the spin echo image $E_3$ by a weighting factor image $w3^*$, weighting the modified gradient echo image $E_2^*$ by a weighting factor image w2*, and weighting the modified gradient echo image E$_4$* by a weighting factor image w4* where:

$$w3^* = \frac{1}{1 + (1/w2)^2 + (1/w4)^2} = \frac{w2^2 w4^2}{w2^2 w4^2 + w2^2 + w4^2}$$

$$w2^* = \frac{(1/w2)^2}{1 + (1/w2)^2 + (1/w4)^2} = \frac{w4^2}{w2^2 w4^2 + w2^2 + w4^2}$$

$$w4^* = \frac{(1/w4)^2}{1 + (1/w2)^2 + (1/w4)^2} = \frac{w2^2}{w2^2 w4^2 + w2^2 + w4^2}$$

prior to being summed.

10. The method of claim 8 including the additional steps of weighting the spin echo image E$_3$ by a weighting factor image w3*, weighting the modified gradient echo image E$_2$* by a weighting factor image w2*, and weighting the modified gradient echo image E$_4$* by a weighting factor image w4* where:

$$w3^* = \frac{w2^2 w4^2 + (1-\alpha)w2^2 + (1-\alpha)w4^2}{w2^2 w4^2 + w2^2 + w4^2}$$

$$w2^* = \frac{\alpha w4^2}{w2^2 w4^2 + w2^2 + w4^2}$$

$$w4^* = \frac{\alpha w2^2}{w2^2 w4^2 + w2^2 + w4^2}$$

$$0 \leq \alpha \leq 1$$

prior to being summed.

11. The method of claim 10 where α is chosen to be small for pixels where the high frequency content of gradient echo image differs from the high frequency content of the spin echo image.

12. The method of claim 10 where α is chosen to be small in regions of the image with short T$_2$'.

13. A method of producing an NMR image based on T$_2$' comprising the steps of:
    (a) applying a polarizing magnetic field to the object to be imaged;
    (b) exciting the nuclei in the object with an RF excitation pulse;
    (c) applying a spin echo producing RF pulse to produce a spin echo signal at a first time T;
    (d) acquiring the spin echo signal at the first time T during the application of a first read out gradient along an axis;
    (e) acquiring a first and second gradient echo signal at a time τ prior to T and a time τ subsequent to T during the application of a second and third read out gradient along an axis;
    (f) repeating steps (a)–(e) to compile a spin echo data set from the spin echo signals and a first and second gradient echo data set from the first and second gradient echo signals;
    (g) reconstructing the spin echo data set and first and second gradient echo data sets to produce spin echo images E$_3$ and gradient echo images E$_2$ and E$_4$ respectively; and
    (h) combining the corresponding pixels of the images to produce a composite image dependent on T$_2$'.

14. The method of claim 12 where the composite image dependent on T$_2$' is produced by combining the pixels of spin echo image E$_3$ and gradient echo images E$_2$ and E$_4$ according to the following formula:

$$T_2' = 2\tau/\ln((E_3)^2/E_2 E_4).$$

15. A method producing an NMR image based on T$_2$ comprising the steps of:
    (a) applying a polarizing magnetic field to the object to be imaged;
    (b) exciting the nuclei in the object with an RF excitation pulse;
    (c) applying a spin echo producing RF pulse to produce a spin echo signal at a time T;
    (d) acquiring a first and second gradient echo signal at a time t prior to T and a time t subsequent to T during the application of a first and second read out gradient along an axis;
    (e) repeating steps (a)–(d) to compile a first and second gradient echo data sets from the first and second gradient echo signals;
    (f) reconstructing the first and second gradient echo data sets to produce gradient echo images E$_2$ and E$_4$ respectively; and
    (g) calculating a composite image dependent on T$_2$.

16. The method of claim 15 where the composite image dependent on T$_2$ is produced by combining the pixels of the gradient echo images E$_2$ and E$_4$ according to the following formula:

$$T_2 = 2\tau/\ln(E_2/E_4).$$

17. A method of estimating the effect of imperfections in a spin echo producing RF pulse comprising the steps of:
    (a) applying a polarizing magnetic field to the object to be imaged;
    (b) exciting the nuclei in the object with an RF excitation pulse;
    (c) applying a first spin echo producing RF pulse to produce a first spin echo signal at a first time TE$_1$;
    (d) acquiring the first spin echo signal at the first time TE$_1$ during the application of a first read out gradient;
    (e) applying a second spin echo producing RF pulse to produce a second spin echo signal at a second time TE$_2$;
    (f) acquiring the second spin echo signal at the second time TE$_2$ during the application of a second read out gradient;
    (g) acquiring a first and second gradient echo signal at a time τ prior to TE$_2$ and a time τ subsequent to TE$_2$ during the application of a third and fourth read out gradient;
    (h) repeating steps (a)–(g) to compile a first and second spin echo data set from the first and second spin echo signals and a first and second gradient echo data set from the first and second spin echo signals;
    (i) reconstructing the first and second spin echo data sets to produce spin echo images E$_1$ and E$_3$, respectively, and reconstructing the first and second gradient echo data sets to produce gradient echo images E$_2$ and E$_4$ respectively; and
    (j) calculating an error factor image F from the first and second gradient echo images E$_2$ and E$_4$ and the first and second spin echo images E$_1$ and E$_3$.

18. The method of claim 8 where the error factor image F is produced by combining the pixels of the first and second gradient echo images E$_2$ and E$_4$ and the first and second spin echo images gradient echo images E$_1$ and E$_3$ according to the following formula:

$$F = (E_3/E_1)(E_2/E_4)^{\Delta TE/2t}.$$

19. The method of claim 8 including the additional step of correcting the second spin echo image $E_3$ by dividing each pixel of $E_3$ by the corresponding pixel of F.

20. The method of claim 8 including the additional steps of:
low pass filtering F to produce a smoothly varying $F^*$ as a function of the image space; and
producing an image $T_{2,corr.} = \Delta TE/ln(F^*E_1/E_3)$.

* * * * *